(12) United States Patent
Kim et al.

(10) Patent No.: US 12,010,877 B2
(45) Date of Patent: Jun. 11, 2024

(54) DISPLAY DEVICE

(71) Applicant: LG DISPLAY CO., LTD., Seoul (KR)

(72) Inventors: HongSik Kim, Paju-si (KR); MinJic Lee, Paju-si (KR); Yeseul Han, Paju-si (KR); JeongOk Jo, Paju-si (KR); Kwanghyun Choi, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 345 days.

(21) Appl. No.: 17/411,714

(22) Filed: Aug. 25, 2021

(65) Prior Publication Data

US 2022/0069039 A1 Mar. 3, 2022

(30) Foreign Application Priority Data

Sep. 1, 2020 (KR) .................. 10-2020-0110807

(51) Int. Cl.
*H10K 59/122* (2023.01)
*H10K 50/842* (2023.01)
*H10K 59/124* (2023.01)

(52) U.S. Cl.
CPC ....... *H10K 59/122* (2023.02); *H10K 50/8428* (2023.02); *H10K 59/124* (2023.02)

(58) Field of Classification Search
CPC ............ H10K 59/122; H10K 50/8428; H10K 59/124; H10K 50/8426; H10K 59/12; H10K 50/11; H10K 50/81; H10K 50/82; H10K 77/111; H10K 2102/311; Y02E 10/549
See application file for complete search history.

(56) References Cited

U.S. PATENT DOCUMENTS

| | | | | |
|---|---|---|---|---|
| 9,076,739 | B2 * | 7/2015 | Choi | H10K 59/122 |
| 2004/0004214 | A1 * | 1/2004 | Yamazaki | H10K 50/8445 |
| | | | | 257/40 |
| 2004/0160165 | A1 * | 8/2004 | Yamauchi | H10K 59/173 |
| | | | | 313/498 |
| 2005/0116632 | A1 * | 6/2005 | Funamoto | H10K 71/135 |
| | | | | 313/506 |
| 2009/0194780 | A1 * | 8/2009 | Kwon | H10K 59/122 |
| | | | | 257/98 |
| 2014/0361253 | A1 * | 12/2014 | Choi | H10K 50/805 |
| | | | | 438/34 |
| 2018/0122882 | A1 * | 5/2018 | Lee | H10K 59/131 |
| 2021/0157432 | A1 * | 5/2021 | Lee | G06F 3/0412 |
| 2022/0013607 | A1 * | 1/2022 | Lee | H10K 59/38 |

FOREIGN PATENT DOCUMENTS

| | | |
|---|---|---|
| KR | 10-2005-0082951 A | 4/2006 |
| KR | 10-2010-0130303 A | 9/2015 |
| KR | 10-2017-0123569 A | 11/2017 |
| KR | 10-2019-0077878 A | 7/2019 |
| KR | 10-2019-0135586 A | 12/2019 |
| KR | 10-2020-0036288 A | 4/2020 |

* cited by examiner

*Primary Examiner* — Kevin Quarterman
(74) *Attorney, Agent, or Firm* — POLSINELLI PC

(57) ABSTRACT

A display device includes a substrate; a bank defining a plurality of emission areas on the substrate; a plurality of light emitting elements at the plurality of emission areas; a plurality of spacers on the bank to surround peripheral portions of the plurality of emission areas, and the plurality of spacers are spaced apart from each other, so that film delamination of a light emitting element can be prevented by minimizing transmission of an impact to the light emitting element.

18 Claims, 10 Drawing Sheets

DISPLAY DEVICE

CROSS-REFERENCE TO RELATED APPLICATION

This application claims the benefit of and priority to Korean Patent Application No. 10-2020-0110807 filed on Sep. 1, 2020, which is hereby incorporated by reference in its entirety.

BACKGROUND

Field of the Disclosure

The present disclosure relates to a display device, and more particularly, to a display device capable of improving durability and reliability by mitigating an impact applied to a light emitting element.

Description of the Background

Recently, as our society advances toward an information-oriented society, the field of display device for visually expressing an electrical information signal has rapidly advanced. Various display devices having excellent performance in terms of thinness, lightness, and low power consumption, are being developed correspondingly.

Specifically, flat panel display devices such as a liquid crystal display device using an LED (Light Emitting Diode) as a light source and an organic light emitting diode display (OLED) device using a self-luminous OLED as a light source have received considerable attention as next-generation display devices due to small thicknesses and low power consumption thereof. In particular, in recent years, flexible display devices such as bendable display devices or foldable display devices have been developed.

The flexible display device may be implemented by configuring a substrate of a plastic material. Since the flexible display device can be easily carried when folded and can realize a large screen when unfolded, it can be applied to various application fields such as televisions and monitors as well as mobile equipment such as mobile phones, e-books, and electronic newspapers.

SUMMARY

Accordingly, the present disclosure is to provide a display device capable of mitigating an impact of a light emitting element by disposing a spacer surrounding the light emitting element.

The present disclosure is also to provide a display device capable of preventing film delamination of a light emitting element by minimizing transmission of an impact to the light emitting element.

The present disclosure is not limited to the above-mentioned features, which are not mentioned above, can be clearly understood by those skilled in the art from the following descriptions.

According to an aspect of the present disclosure, a display device includes a substrate; a bank defining a plurality of emission areas on the substrate; a plurality of light emitting elements at the plurality of emission areas; and a plurality of spacers on the bank to surround peripheral portions of the plurality of emission areas. The plurality of spacers are spaced apart from each other.

According to another aspect of the present disclosure, a display device includes a substrate including a plurality of sub-pixels; a plurality of light emitting elements at the plurality of sub-pixels and each of the plurality of light emitting elements include an anode, a light emitting layer, and a cathode; a bank disposed between the plurality of light emitting elements; and a plurality of impact mitigation spacers on the bank and disposed along peripheral portions of the plurality of light emitting elements. The plurality of impact mitigation spacers have a closed-loop shape.

Other detailed matters of the exemplary aspects are included in the detailed description and the drawings.

According to the present disclosure, spacers are disposed to surround emission areas, so that impacts transmitted to light emitting elements can be minimized.

According to the present disclosure, by mitigating an impact of a light emitting element, separation in the light emitting element can be prevented and defects thereof can be improved.

The effects according to the present disclosure are not limited to the contents exemplified above, and more various effects are included in the present specification.

BRIEF DESCRIPTION OF THE DRAWINGS

The accompanying drawings, which are included to provide a further understanding of the disclosure and are incorporated in and constitute a part of the disclosure, illustrate aspects of the disclosure and together with the description serve to explain the principle of the disclosure.

In the drawings.

DETAILED DESCRIPTION OF THE ASPECTS

Figure 1:
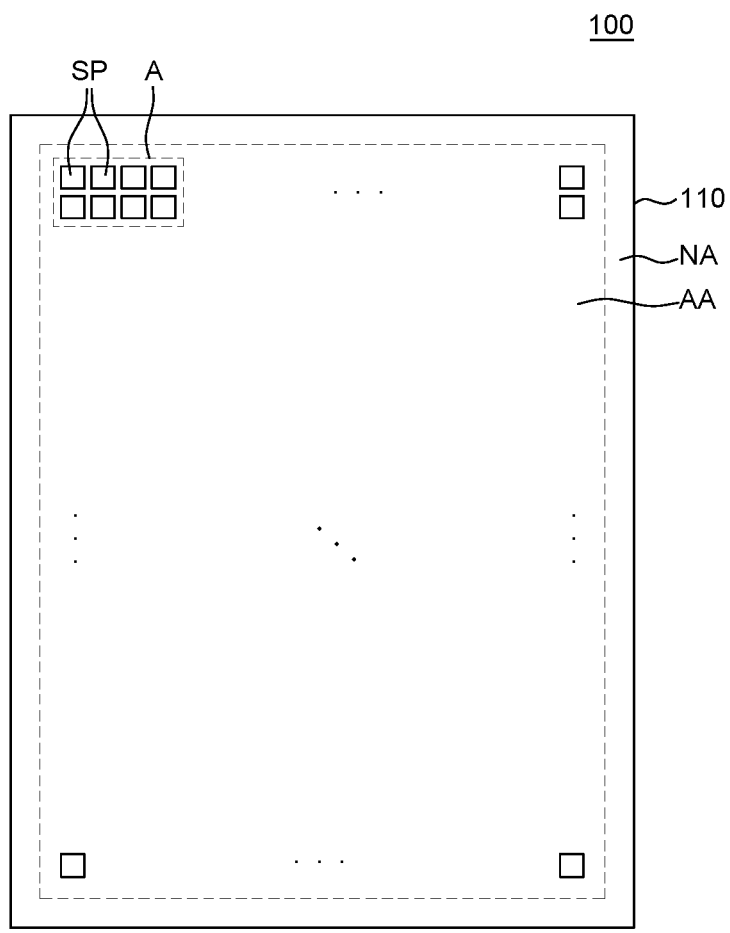
FIG. 1 is a plan view of a display device according to an exemplary aspect of the present disclosure.

Advantages and characteristics of the present disclosure and a method of achieving the advantages and characteristics will be clear by referring to exemplary aspects described below in detail together with the accompanying drawings. However, the present disclosure is not limited to the exemplary aspects disclosed herein but will be implemented in various forms. The exemplary aspects are provided by way of example only so that those skilled in the art can fully understand the disclosures of the present disclosure and the scope of the present disclosure. Therefore, the present disclosure will be defined only by the scope of the appended claims.

The shapes, sizes, ratios, angles, numbers, and the like illustrated in the accompanying drawings for describing the exemplary aspects of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "consist of" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on", "above", "below", and "next", one or more parts may be positioned between the two parts unless the terms are used with the term "immediately" or "directly".

When an element or layer is disposed "on" another element or layer, another layer or another element may be interposed directly on the other element or therebetween.

Although the terms "first", "second", and the like are used for describing various components, these components are not confined by these terms. These terms are merely used for distinguishing one component from the other components. Therefore, a first component to be mentioned below may be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various aspects of the present disclosure can be partially or entirely adhered to or combined with each other and can be interlocked and operated in technically various ways, and the aspects can be carried out independently of or in association with each other.

Hereinafter, the present disclosure will be described in detail with reference to accompanying drawings.

FIG. 1 is a plan view of a display device according to an exemplary aspect of the present disclosure. In FIG. 1, only a substrate 110 and a plurality of sub-pixels SP among various components of a display device 100 are illustrated for convenience of explanation.

The substrate 110 is a support member for supporting other components of the display device 100, and may be formed of an insulating material. For example, the substrate 110 may be formed of glass or resin. In addition, the substrate 110 may include a polymer or plastic such as polyimide (PI), or may be formed of a material having flexibility.

The substrate 110 includes a display area AA and a non-display area NA.

The display area AA is an area for displaying an image. The plurality of sub-pixels SP for displaying an image and a driving circuit for driving the plurality of sub-pixels SP may be disposed in the display area AA. The plurality of respective sub-pixels SP are individual units emitting light, and may include a red sub-pixel, a green sub-pixel, a blue sub-pixel, and a white sub-pixel, but the present disclosure is not limited thereto. Each of the plurality of sub-pixels SP may include an emission area EA and a non-emission area other than the emission area EA, which will be described later with reference to FIG. 2. The emission area EA may be an area in which a light emitting element 130 is disposed to substantially emit light. The non-emission area is an area where light emission is not made, and may be an area in which the driving circuit is disposed. The driving circuit may include various thin film transistors, storage capacitors, and lines for driving the plurality of sub-pixels SP. For example, the driving circuit may include various components such as a driving transistor, a switching transistor, a sensing transistor, a storage capacitor, a gate line, and a data line, but is not limited thereto.

The non-display area NA is an area in which an image is not displayed, and is an area in which various lines, driver ICs, and the like for driving the sub-pixels SP disposed in the display area AA are disposed. For example, various driver ICs such as a gate driver IC and a data driver IC may be disposed in the non-display area NA.

Meanwhile, although it is illustrated that the non-display area NA surrounds the display area AA in FIG. 1, the non-display area NA may be an area extending from one side of the display area AA, but is not limited thereto.

Figure 2:
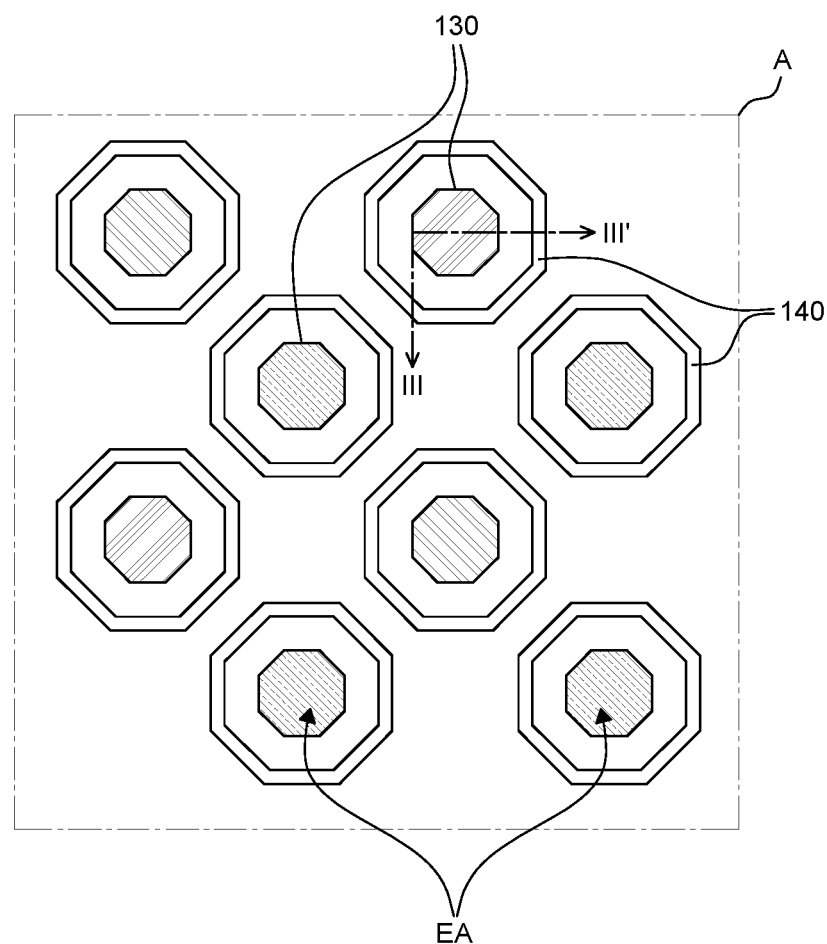
FIG. 2 is an enlarged plan view of area A of FIG. 1.

Hereinafter, FIG. 2 is referred for a more detailed description of the display area AA.

FIG. 2 is an enlarged plan view of area A of FIG. 1. In FIG. 2, only a plurality of emission areas EA, a plurality of light emitting elements 130, and a plurality of spacers 140 are illustrated for convenience of explanation.

Referring to FIG. 2, the display area AA of the substrate 110 includes the plurality of emission areas EA. The plurality of emission areas EA may be defined by a bank 116 to be described later in FIG. 3. Although it is illustrated that the plurality of emission areas EA have an octagonal shape in FIG. 2, the present disclosure is not limited thereto. Also, although it is illustrated that the areas of the plurality of emission areas EA are equal to each other in FIG. 2, the present disclosure is not limited thereto. For example, the plurality of emission areas EA may be formed to have different areas according to luminous efficiency of the light emitting elements 130 corresponding thereto.

The light emitting element 130 is disposed in each of the plurality of emission areas EA. The light emitting element 130 may be a region from which light is emitted to implement an actual image. The light emitting element 130 may include an anode 131, a light emitting layer 132, and a cathode 133. The light emitting element 130 may include a red light emitting element, a green light emitting element, a blue light emitting element, or a white light emitting element depending on a type of the light emitting layer 132, but is not limited thereto.

The plurality of spacers 140 are disposed to surround the plurality of respective emission areas EA. That is, the plurality of spacers 140 may be formed along peripheral portions of the plurality of light emitting elements 130. Accordingly, the plurality of spacers 140 may have a closed-loop shape. Also, the plurality of spacers 140 may be disposed to be spaced apart from each other. The plurality of spacers 140 may be disposed to be spaced apart from the plurality of light emitting elements 130 by a predetermined distance in consideration of a process margin, but are not limited thereto. The plurality of spacers 140 may be impact mitigation spacers. That is, the plurality of spacers 140 may mitigate external impacts applied to the plurality of light emitting elements 130. Meanwhile, although it is illustrated that the plurality of spacers 140 have an octagonal shape in FIG. 2, the present disclosure is not limited thereto.

Figure 3:
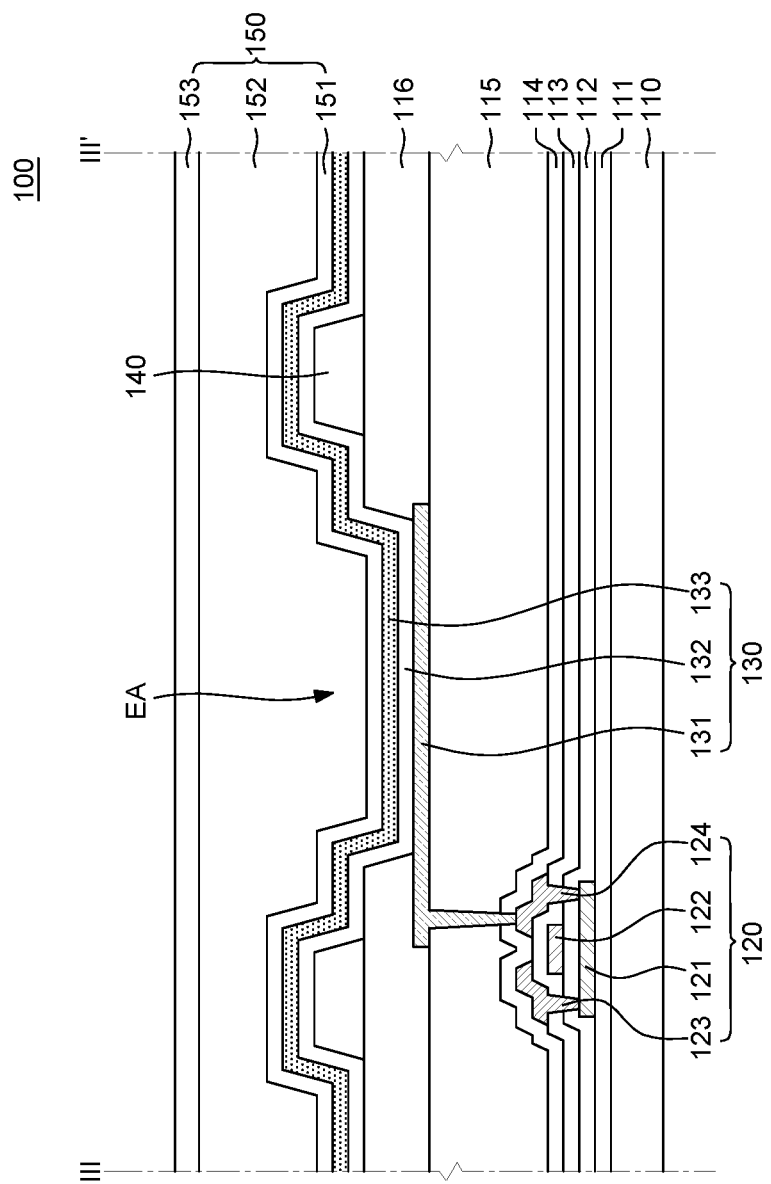
FIG. 3 is a cross-sectional view taken along line of FIG. 2.

Hereinafter, FIG. 3 is referred for a more detailed description of the display device 100.

FIG. 3 is a cross-sectional view taken along line III-III' of FIG. 2.

Referring to FIG. 3, the display device 100 includes the substrate 110, a transistor 120, the light emitting element 130, the spacer 140, and an encapsulation unit 150.

A buffer layer 111 is disposed on the substrate 110. The buffer layer 111 may reduce penetration of moisture or impurities through the substrate 110. The buffer layer 111 may be formed of, for example, a single layer or multilayers of silicon oxide (SiOx) or silicon nitride (SiNx), but is not limited thereto. However, the buffer layer 111 may be omitted depending on a type of the substrate 110 or a type of the transistor, but is not limited thereto.

The transistor 120 may be disposed on the buffer layer 111 to drive the light emitting element 130. The transistor 120 includes an active layer 121, a gate electrode 122, a source electrode 123, and a drain electrode 124. The transistor 120 illustrated in FIG. 3 is a driving transistor, and is a thin film transistor having a top gate structure in which the gate electrode 122 is disposed above the active layer 121. However, the present disclosure is not limited thereto, and the transistor 120 may be implemented as a thin film transistor having a bottom gate structure. Also, although only the driving transistor among various transistors 120 included in the display device 100 is illustrated in FIG. 3 for convenience of explanation, other transistors such as a switching transistor and the like may also be disposed.

The active layer 121 is disposed on the buffer layer 111. The active layer 121 is a region in which a channel is formed when the transistor 120 is driven. The active layer 121 may be formed of a semiconductor material such as an oxide semiconductor, amorphous silicon, or polysilicon, but is not limited thereto. For example, when the active layer 121 is formed of an oxide semiconductor, the active layer 121 includes a channel region, a source region, and a drain region, and the source region and the drain region may be conductive regions, but are not limited thereto.

A gate insulating layer 112 is disposed on the active layer 121. The gate insulating layer 112 is an insulating layer for insulating the active layer 121 and the gate electrode 122 and may be formed of a single layer or multilayers of silicon oxide (SiOx) or silicon nitride (SiNx), but is not limited thereto.

The gate electrode 122 is disposed on the gate insulating layer 112. The gate electrode 122 is disposed on the gate insulating layer 112 to overlap the channel region of the active layer 121. The gate electrode 122 may be formed of a conductive material, for example, copper (Cu), aluminum (Al), molybdenum (Mo), nickel (Ni), titanium (Ti), chromium (Cr), or an alloy thereof, but it is not limited thereto.

An interlayer insulating layer 113 is disposed on the gate electrode 122. Contact holes for respectively connecting the source electrode 123 and the drain electrode 124 to the active layer 121 are formed in the interlayer insulating layer 113. The interlayer insulating layer 113 may be formed of a single layer or multilayers of silicon oxide (SiOx) or silicon nitride (SiNx), but is not limited thereto.

The source electrode 123 and the drain electrode 124 are disposed on the interlayer insulating layer 113 to be spaced apart from each other. The source electrode 123 and the drain electrode 124 are electrically connected to the active layer 121 through contact holes of the gate insulating layer 112 and the interlayer insulating layer 113. The source electrode 123 and the drain electrode 124 may be formed of a conductive material, for example, copper (Cu), aluminum (Al), molybdenum (Mo), nickel (Ni), titanium (Ti), chromium (Cr), or an alloy thereof, but are not limited thereto.

A passivation layer 114 for protecting the transistor 120 is disposed on the transistor 120. The passivation layer 114 is an insulating layer for protecting components under the passivation layer 114. A contact hole for exposing the drain electrode 124 of the transistor 120 is formed in the passivation layer 114. Although it is illustrated that the contact hole for exposing the drain electrode 124 is formed in the passivation layer 114 in FIG. 3, a contact hole for exposing the source electrode 123 may be formed. The passivation layer 114 may be formed of a single layer or multilayers of silicon oxide (SiOx) or silicon nitride (SiNx), but is not limited thereto. Also, the passivation layer 114 may be omitted according to aspects.

A planarization layer 115 is disposed on the passivation layer 114. The planarization layer 115 is an insulating layer that planarizes an upper portion of the substrate 110. A contact hole for exposing the drain electrode 124 of the transistor 120 is formed in the planarization layer 115. However, a contact hole for exposing the source electrode 123 may be formed in the planarization layer 115. The planarization layer 115 may be formed of an organic material, for example, may be formed of a single layer or multilayers of polyimide or photo acryl, but is not limited thereto.

The plurality of light emitting elements 130 are disposed at each of the plurality of emission areas EA on the planarization layer 115. Each of the plurality of light emitting elements 130 includes the anode 131, the light emitting layer 132, and the cathode 133.

The anode 131 is disposed on the planarization layer 115. The anode 131 may be electrically connected to the drain electrode 124 of the transistor 120 through the contact holes formed in the passivation layer 114 and the planarization layer 115. The anode 131 may be formed of a conductive material having a high work function in order to supply holes to the light emitting layer 132. For example, the anode 131 may be formed of a transparent conductive material such as indium tin oxide (ITO) or indium zinc oxide (IZO), but is not limited thereto.

Meanwhile, the display device 100 may be implemented in a top emission method or a bottom emission method. In the case of the top emission method, a reflective layer for reflecting light that is emitted from the light emitting layer 132 toward the cathode 133 may be disposed below the anode 131. For example, the reflective layer may include a material having excellent reflectivity, such as aluminum (Al) or silver (Ag), but is not limited thereto. Conversely, in the case of the bottom emission method, the anode 131 may be formed of only a transparent conductive material. Hereinafter, it is assumed that the display device 100 according to an exemplary aspect of the present disclosure is in the top emission method.

The bank 116 is disposed on the anode 131 and the planarization layer 115. The bank 116 is an insulating layer disposed between the plurality of emission areas EA to separate the plurality of emission areas EA. The bank 116 may cover a portion of the anode 131 of the light emitting element 130 and define the emission area EA from which light is substantially emitted. That is, the bank 116 includes an opening exposing a portion of the anode 131. The bank 116 may be formed of an organic insulating material disposed to cover an edge or a corner portion of the anode 131. For example, the bank 116 may be formed of polyimide, acryl, or benzo cyclobutene (BCB)-based resin, but is not limited thereto.

The spacer 140 is disposed on the bank 116. The spacer 140 is disposed on the bank 116 to maintain a predetermined distance from a fine metal mask (FMM) that is a deposition mask when the light emitting element 130 is formed. By the spacer 140, the bank 116 and the anode 131 may maintain a predetermined distance from the deposition mask, and damage due to contact may be prevented.

In particular, the plurality of spacers 140 are provided to correspond to the plurality of emission areas EA on a one by one basis. Each of the plurality of spacers 140 may be formed in a closed-loop shape in which it surrounds a peripheral portion of the emission area EA. Since the plurality of spacers 140 are disposed to completely surround the plurality of emission areas EA, impacts of the plurality of light emitting elements 130 may be mitigated. That is, when an external impact is applied to the display device 100, the external impact may be concentrated on the plurality of spacers 140. Accordingly, it is possible to prevent an external impact from being transmitted to the plurality of light emitting elements 130. Accordingly, damage or separation of the light emitting element 130 due to the external impact may be prevented, and reliability and durability of the display device 100 may be increased.

The plurality of spacers 140 may be formed of an organic material having excellent impact absorption and flexibility. For example, the plurality of spacers 140 may be formed of polyimide, polyamide, acryl, epoxy, phenolic, olefin, or rubber resin, but is not limited thereto.

A width of the plurality of spacers 140 may be 5 μm to 25 μm. When the width of the plurality of spacers 140 is less than 5 μm, impact mitigation effects may be insignificant. When the width of the plurality of spacers 140 is greater than 25 μm, the plurality of spacers 140 may be formed to encroach on the emission areas EA, which is not desirable. Specifically, when a process error occurs, the plurality of spacers 140 may also be formed on the emission areas EA, and the areas of the emission areas EA may decrease, which may cause defects. The plurality of spacers 140 may have a thickness of 1 μm to 3 μm. When the thickness of the plurality of spacers 140 is less than 1 μm, a sufficient distance may not be secured between the bank 116 and the anode 131 and the deposition mask. That is, since a distance between the bank 116 and the anode 131 and the deposition mask is small, damage may occur due to their contact. In addition, as the plurality of spacers 140 have a small thickness, the impact mitigation effect may be insignificant. When the thickness of the plurality of spacers 140 is greater than 3 μm, a thickness of the entirety of the display device 100 increases, which is not desirable.

The light emitting layer 132 is disposed on the anode 131, the bank 116, and the spacer 140. The light emitting layer 132 may be formed over an entire surface of the substrate 110. The light emitting layer 132 may be an organic layer for emitting light of a specific color. The light emitting layer 132 may further include various layers such as a hole transport layer, a hole injection layer, a hole blocking layer, an electron injection layer, an electron blocking layer, an electron transport layer, and the like. Different light emitting layers 132 may be disposed in the plurality of respective emission areas EA, or the same light emitting layers 132 may be disposed in the plurality of respective emission areas EA. For example, when different light emitting layers 132 are disposed in the plurality of respective emission areas EA, the light emitting layers 132 may include a red light emitting layer, a green light emitting layer, and a blue light emitting layer. Alternatively, the light emitting layers 132 disposed in the plurality of respective emission areas EA may be connected to each other to form a single layer. In this case, light emitted from the light emitting layers 132 may be converted into light of various colors through a separate light conversion layer, a color filter or the like.

The cathode 133 is disposed on the light emitting layer 132. The cathode 133 may be formed as a single layer over the entire surface of the substrate 110. That is, the cathodes 133 of the plurality of respective emission areas EA may be connected to each other and formed integrally. Since the cathode 133 supplies electrons to the light emitting layer 132, it may be formed of a conductive material having a low work function. The cathode 133 is formed of, for example, a transparent conductive material such as indium tin oxide (ITO) or indium zinc oxide (IZO), a metal alloy such as MgAg, or an ytterbium (Yb) alloy and may further include a metal doped layer, but the present disclosure is not limited thereto.

The encapsulation unit 150 is disposed on the light emitting element 130. For example, the encapsulation unit 150 is disposed on the cathode 133 to cover the light emitting element 130. The encapsulation unit 150 protects the light emitting element 130 from moisture and the like that penetrates from the outside of the light emitting display device 100. The encapsulation unit 150 includes a first encapsulation layer 151, a foreign material cover layer 152, and a second encapsulation layer 153.

The first encapsulation layer 151 may be disposed on the cathode 133 to suppress penetration of moisture or oxygen. The first encapsulation layer 151 may be formed of an inorganic material such as silicon nitride (SiNx), silicon oxynitride (SiNxOy), or aluminum oxide (AlyOz), but is not limited thereto.

The foreign material cover layer 152 is disposed on the first encapsulation layer 151 to planarize a surface thereof. Also, the foreign material cover layer 152 may cover foreign materials or particles that may be generated during a manufacturing process. The foreign material cover layer 152 may be formed of an organic material, for example, silicon oxycarbon (SiOxCz), acrylic or epoxy-based resin, but is not limited thereto.

The second encapsulation layer 153 is disposed on the foreign material cover layer 152, and may suppress penetration of moisture or oxygen, similarly to the first encapsulation layer 151. In this case, the second encapsulation layer 153 and the first encapsulation layer 151 may be formed to seal the foreign material cover layer 152. Accordingly, moisture or oxygen penetrating into the light emitting element 130 may be more effectively reduced by the second encapsulation layer 153. The second encapsulation layer 153 may be formed of an inorganic material such as silicon nitride (SiNx), silicon oxynitride (SiNxOy), silicon oxide (SiOx), or aluminum oxide (AlyOz), but is not limited thereto.

In the display device, adhesion between the anode and the light emitting layer is relatively weak compared to adhesion between other layers. Accordingly, when an external impact is applied to the display device, a film delamination phenomenon in which a portion of the light emitting layer and the anode is separated may occur. In particular, since the film delamination phenomenon occurs in the light emitting element, there is a defect in which dark spots occur in the emission area. Dark spots degrade display quality and cause defects in the display device.

Accordingly, in the display device 100 according to an exemplary aspect of the present disclosure, the plurality of spacers 140 may be formed to surround the peripheral portions of the plurality of light emitting elements 130. Each of the plurality of spacers 140 may be formed in a closed-loop shape and may be formed along a circumference of each of the plurality of light emitting elements 130. Accordingly, even when an external impact is applied to the display device 100, the external impact may be concentrated on the plurality of spacers 140 surrounding the plurality of light emitting elements 130. Accordingly, the plurality of spacers 140 may prevent an impact from being transmitted to the plurality of light emitting elements 130, and may mitigate the impact applied to the plurality of light emitting elements 130. That is, durability and reliability of the display device 100 may be increased.

In particular, the plurality of spacers 140 may reduce dark spot defects of the plurality of emission areas EA. Specifically, since the plurality of spacers 140 can mitigate the impact of the plurality of light emitting elements 130, it is possible to prevent film delamination due to external impacts in the light emitting element 130. That is, separation between the anode 131 and the light emitting layer 132 is prevented, so that a dark spot defects can be prevented. Accordingly, the display quality of the display device 100 may be improved, and defects thereof may be improved.

Figure 4:
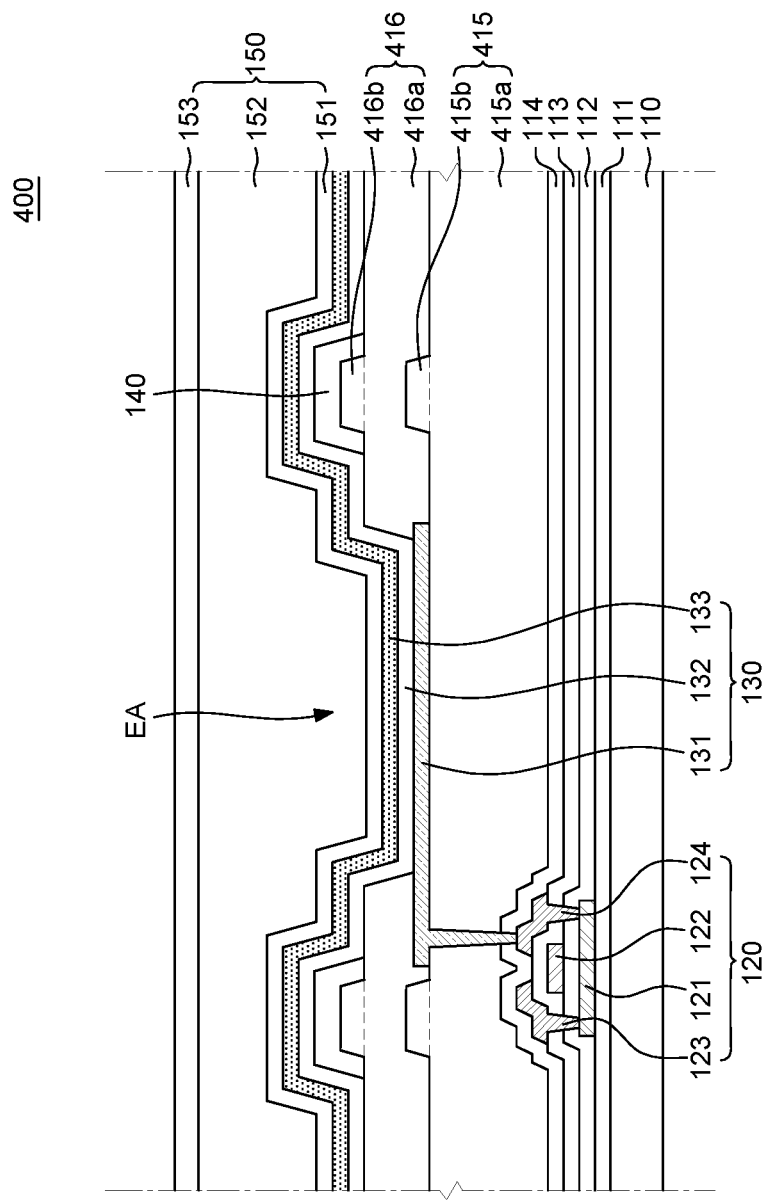
FIGS. 4, 5A, 5B, 6A, 6B, 7A and 7B illustrate display devices according to various aspects of the present disclosure.

FIG. 4 is a cross-sectional view of a display device according to another exemplary aspect of the present disclosure. A display device 400 of FIG. 4 has substantially the same configuration as the display device 100 of FIGS. 1 to 3, except for a planarization layer 415 and a bank 416, and thus, a redundant description thereof will be omitted.

Referring to FIG. 4, the display device 400 according to another exemplary aspect of the present disclosure includes the planarization layer 415 including a first protrusion pattern 415b and the bank 416 including a second protrusion pattern 416b.

The planarization layer 415 includes a base portion 415a and the first protrusion pattern 415b. The base portion 415a may planarize the upper portion of the substrate 110 on the thin film transistor 120. The first protrusion pattern 415b protrudes upward from the base portion 415a. The first protrusion pattern 415b may be disposed to surround the emission area EA. That is, the first protrusion pattern 415b may be formed in a closed-loop shape along the peripheral portion of the light emitting element 130. The first protrusion pattern 415b may be provided in plural to correspond to the plurality of emission areas EA. In this case, the plurality of first protrusion patterns 415b may be disposed to be spaced apart from each other. The plurality of first protrusion patterns 415b may be impact mitigation patterns. That is, an external impact applied to the plurality of light emitting elements 130 may be mitigated by the plurality of first protrusion patterns 415b. Meanwhile, the planarization layer 115 may be formed of an organic material, for example, a single layer or multilayers of polyimide or photo acryl, but is not limited thereto.

The bank 416 includes a base portion 416a and the second protrusion pattern 416b. The base portion 416a may define the plurality of emission areas EA on the anode 131 and the planarization layer 415. The second protrusion pattern 416b protrudes upward from the base portion 416a. The second protrusion pattern 416b may be disposed to surround the emission area EA. That is, the second protrusion pattern 416b may be formed in a closed-loop shape along the peripheral portion of the light emitting element 130. The second protrusion pattern 416b may be provided in plural to correspond to the plurality of emission areas EA. In this case, the plurality of second protrusion patterns 416b may be disposed to be spaced apart from each other. The plurality of second protrusion patterns 416b may be impact mitigation patterns. That is, an external impact applied to the plurality of light emitting elements 130 may be mitigated by the plurality of second protrusion patterns 416b. Meanwhile, the bank 416 may be formed of an organic material, for example, polyimide, acryl, or benzocyclobutene (BCB)-based resin, but is not limited thereto.

The first protrusion pattern 415b and the second protrusion pattern 416b may be disposed to overlap each other. In particular, the first protrusion pattern 415b and the second protrusion pattern 416b may overlap the spacer 140. In this case, the spacer 140 may be disposed to surround the second protrusion pattern 416b. Accordingly, a peripheral portion of the emission area EA may be completely surrounded by the spacer 140, the first protrusion pattern 415b, and the second protrusion pattern 416b.

Since the emission area EA is triply enclosed by the spacer 140, the first protrusion pattern 415b, and the second protrusion pattern 416b, an impact transmitted to the emission area EA may be more effectively mitigated. Specifically, an external impact applied to the display device 400 may be concentrated on the spacer 140, the first protrusion pattern 415b, and the second protrusion pattern 416b, which are three walls that overlap each other. Accordingly, it is possible to prevent the external impact from being transmitted to the light emitting element 130 disposed in the emission area EA. Accordingly, durability and reliability of the display device 400 may be increased. In addition, dark spot defects of the light emitting element 130 may be improved, so that display quality may be improved.

Figure 5A:
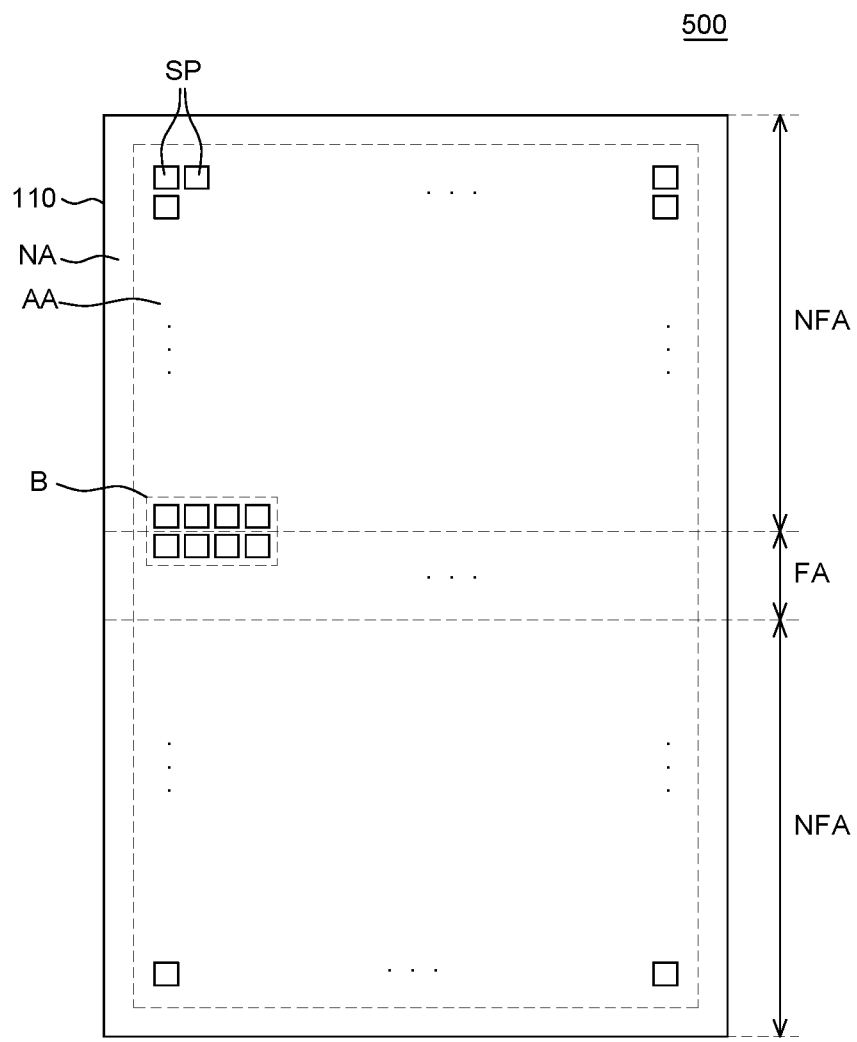
Figure 5B:
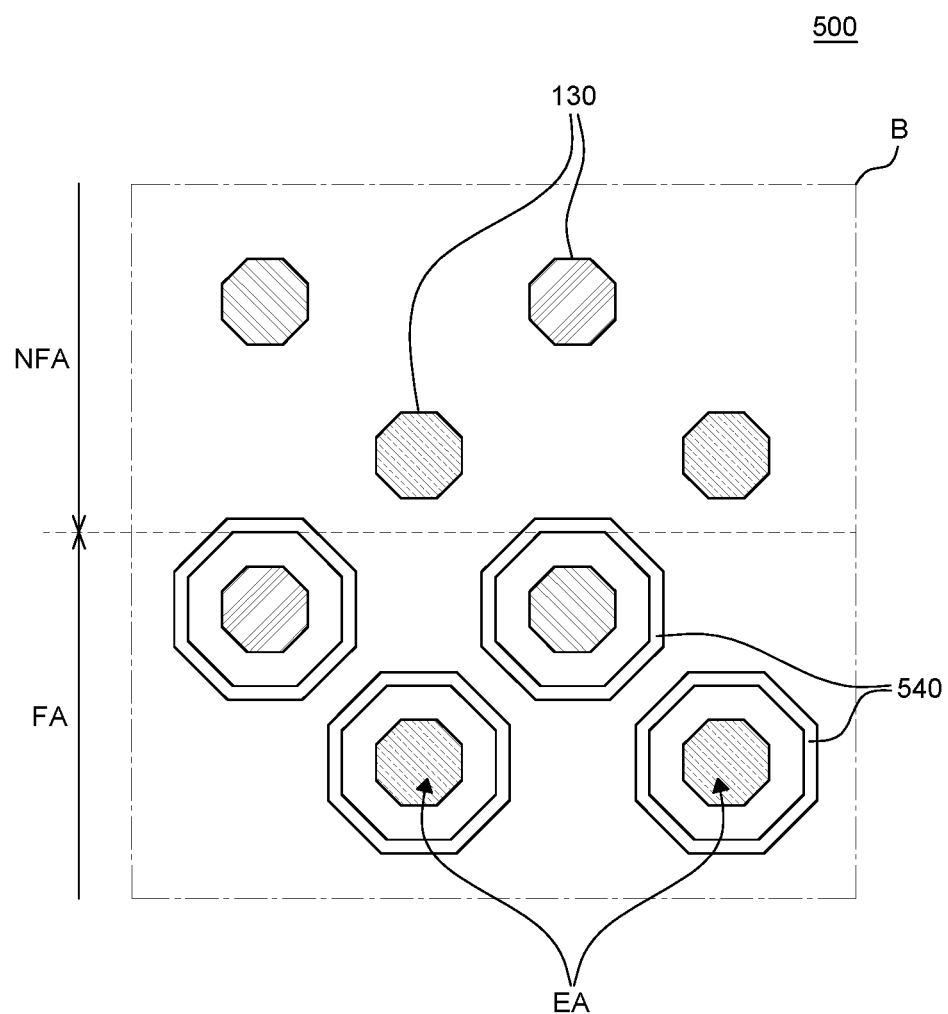

FIG. 5A is a plan view of a display device according to another exemplary aspect of the present disclosure. FIG. 5B is an enlarged plan view of area B of FIG. 5A. A display device 500 of FIGS. 5A and 5B has substantially the same configuration as the display device 100 of FIGS. 1 to 3 except for spacers 540, and thus, a redundant description thereof will be omitted.

Referring to FIGS. 5A and 5B, the display device 500 may be a foldable display device 500. The display device 500 may include a folding area FA and non-folding areas NFA. Hereinafter, descriptions will be given based on that the non-folding areas NFA are disposed on one side and the other side with respect to the folding area FA at a central portion of the display device 500, but the present disclosure is not limited thereto. For example, the folding area FA may be disposed adjacent to one side or the other side of the display device 500 rather than being disposed at the central portion. In addition, a plurality of folding areas FA may be provided so that the display device 500 can be multiply folded.

The plurality of sub-pixels SP are disposed in the folding area FA and the non-folding areas NFA of the display area AA. In this case, each of the plurality of sub-pixels SP includes an emission area EA and a non-emission area. In addition, the plurality of light emitting elements 130 are disposed in the plurality of respective emission areas EA. In addition, a plurality of the spacers 540 are disposed to surround the plurality of emission areas EA. The plurality of spacers 540 may be spaced apart from each other and may be respectively formed in a closed-loop shape along peripheral portions of the emission areas EA. In this case, the plurality of spacers 540 may be disposed to surround only the plurality of emission areas EA disposed in the folding area FA among the plurality of emission areas EA.

Specifically, the plurality of light emitting elements 130 disposed in the folding area FA may receive more impacts than the plurality of light emitting elements 130 disposed in the non-folding area NFA. That is, a relatively large stress may be generated in the plurality of light emitting elements 130 of the folding area FA due to repeated folding operations of the display device 500. Accordingly, in the display device 500 according to another exemplary aspect of the present disclosure, the plurality of spacers 540 may be disposed to surround the plurality of light emitting elements 130 in the folding area FA. Accordingly, an impact applied to the plurality of light emitting elements 130 of the folding area FA may be mitigated, and separation between the anode 131 and the light emitting layer 132 may be prevented. Accordingly, durability and reliability of the display device 500 may be improved, and defects thereof may be improved.

Figure 6A:
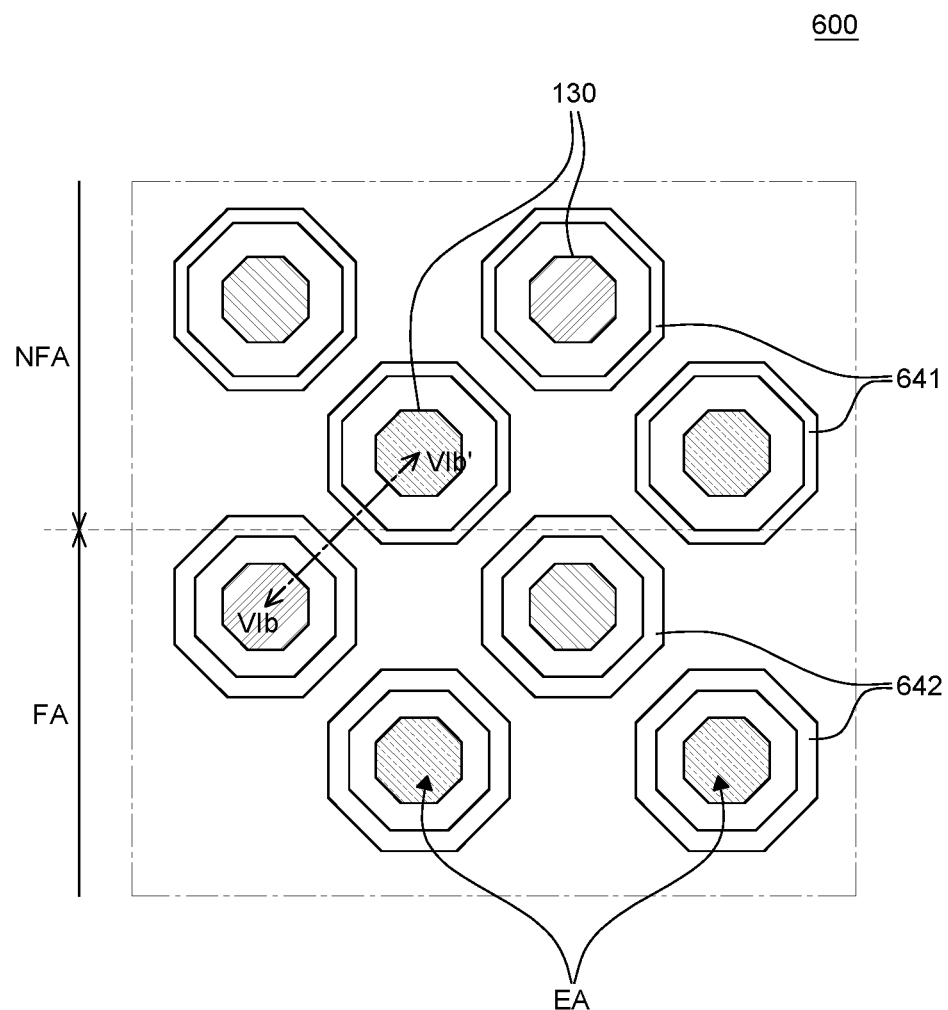
Figure 6B:
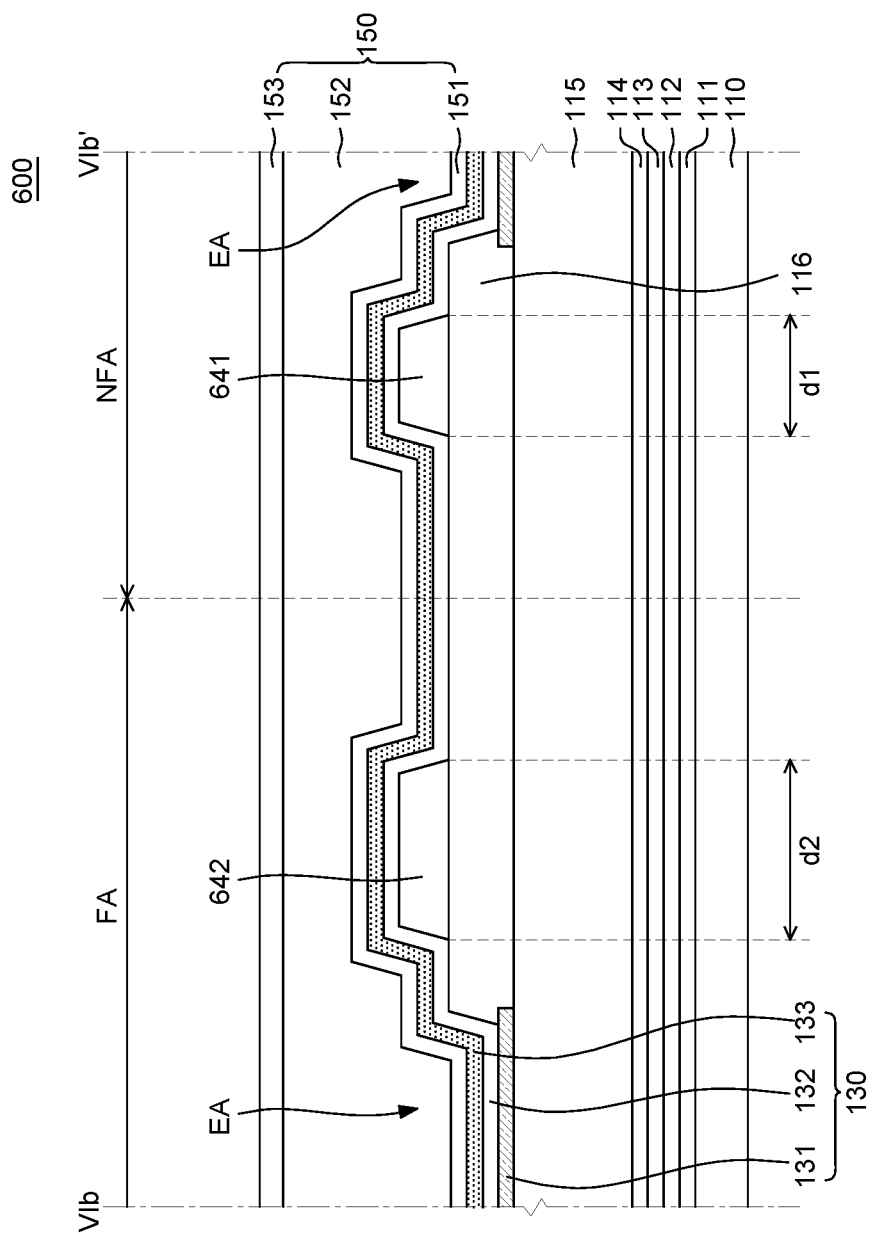

FIG. 6A is an enlarged plan view of a display device according to another exemplary aspect of the present disclosure. FIG. 6B is a cross-sectional view taken along VIb-VIb' of FIG. 6A. A display device 600 of FIGS. 6A and 6B has substantially the same configuration as the display device 100 of FIGS. 1 to 3, except for spacers 641 and 642, and thus, a redundant description thereof will be omitted.

Referring to FIGS. 6A and 6B, a display device 600 may be a foldable display device including a folding area FA and a non-folding area NFA. A plurality of emission areas EA are disposed in the folding area FA and the non-folding area NFA, and a plurality of light emitting elements 130 are disposed in the plurality of respective emission areas EA. In addition, a plurality of the spacers 641 and 642 are disposed to surround the plurality of emission areas EA. The plurality of spacers 641 and 642 may be spaced apart from each other, and may be respectively formed in a closed-loop shape along peripheral portions of the emission areas EA. An impact applied to the plurality of light emitting elements 130 may be mitigated by the plurality of spacers 641 and 642, and durability and reliability of the display device 100 may be improved.

The plurality of spacers 641 and 642 include a plurality of first spacers 641 and a plurality of second spacers 642. The plurality of first spacers 641 may be disposed to surround the plurality of light emitting elements 130 disposed in the non-folding area NFA. The plurality of second spacers 642 may be disposed to surround the plurality of light emitting elements 130 disposed in the folding area FA. In this case, a width d2 of the plurality of second spacers 642 may be greater than a width d1 of the plurality of first spacers 641. Accordingly, the plurality of second spacers 642 may absorb an impact greater than that of the plurality of first spacers 641.

Specifically, the plurality of light emitting elements 130 disposed in the folding area FA may receive a relatively greater amount of impact than the plurality of light emitting elements 130 disposed in the non-folding area NFA. Accordingly, in the display device 600 according to another exemplary aspect of the present disclosure, the width of the plurality of second spacers 642 corresponding to the plurality of light emitting elements 130 of the folding area FA may be formed to be greater than the width of the plurality of first spacers 641 corresponding to the plurality of light emitting elements 130 of the non-folding area NFA. Accordingly, it is possible to more effectively protect the plurality of light emitting elements 130 of the folding area FA in which a relatively large stress occurs.

Figure 7A:
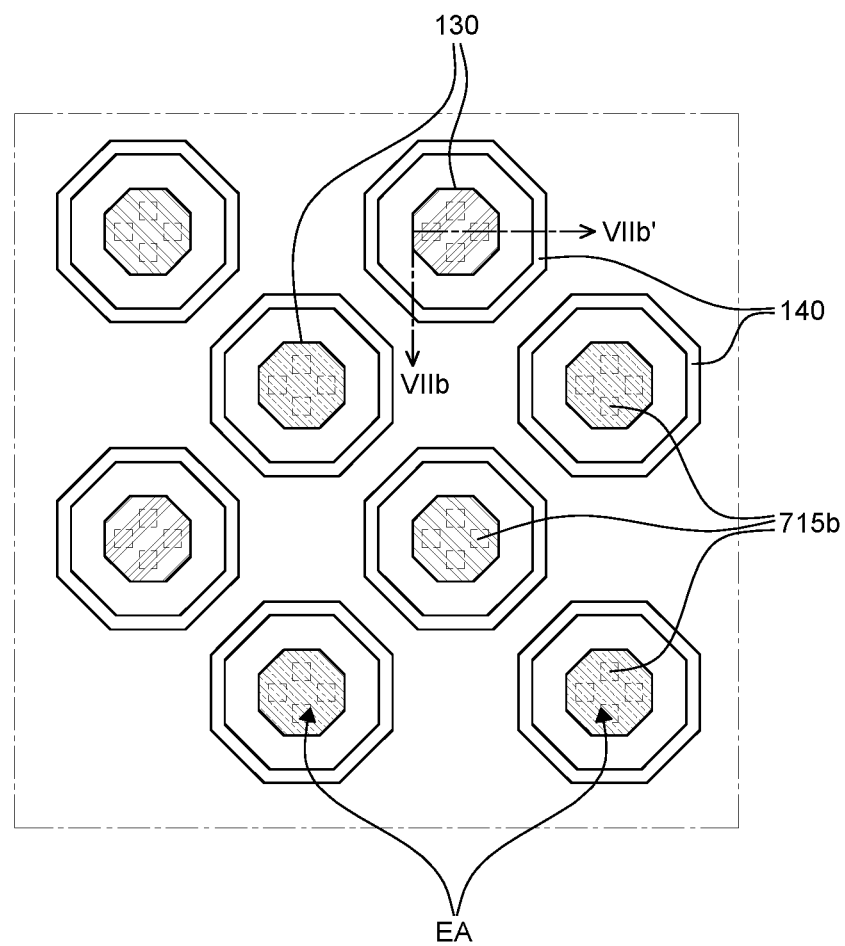
Figure 7B:
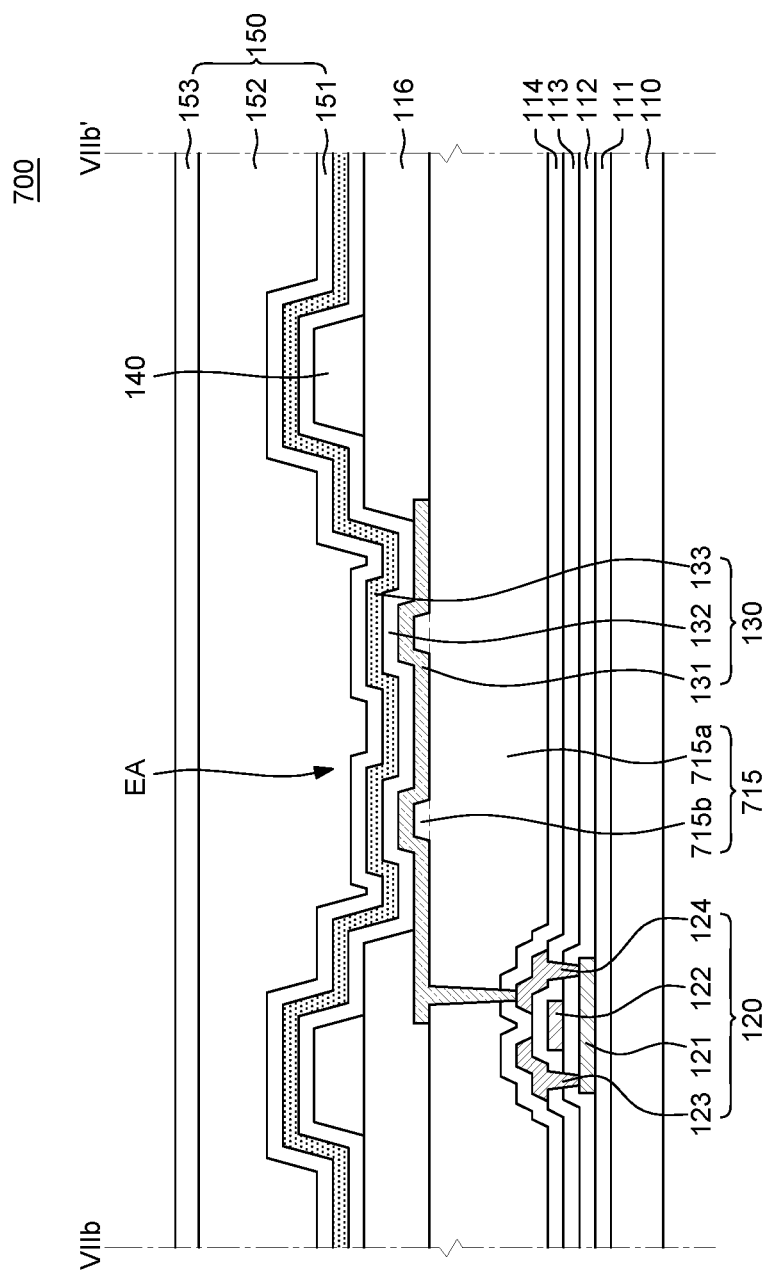

FIG. 7A is an enlarged plan view of a display device according to another exemplary aspect of the present disclosure. FIG. 7B is a cross-sectional view taken along line VIIb-VIIb' of FIG. 7A. A display device 700 of FIGS. 7A and 7B has substantially the same configuration as the display device 100 of FIGS. 1 to 3 except for a planarization layer 715, and thus a redundant description thereof will be omitted.

Referring to FIGS. 7A and 7B, the planarization layer 715 of a display device 700 includes delamination prevention patterns 715b.

The planarization layer 715 includes a base portion 715a and a plurality of the delamination prevention patterns 715b. The base portion 715a may planarize the upper portion of the substrate 110 on the thin film transistor 120. The plurality of delamination prevention patterns 715b protrude upward from the base portion 715a. Alternatively, although not shown in FIGS. 7A and 7B, the plurality of delamination prevention patterns 715b may be concave patterns formed to have a predetermined depth from an upper surface of the base portion 715a. The plurality of delamination prevention patterns 715b may be disposed to correspond to the plurality of emission areas EA. That is, the plurality of delamination prevention patterns 715b may be disposed below the plurality of light emitting elements 130 to be spaced apart from the bank 116. Meanwhile, although it is illustrated that four delamination prevention patterns 715b are formed in one emission area EA in FIG. 7A, the present disclosure is not limited thereto. In addition, shapes and arrangements of the plurality of delamination prevention patterns 715b may be variously changed.

Film delamination of the plurality of light emitting elements 130 may be prevented by the plurality of delamination prevention patterns 715b. Specifically, a contact area between the anode 131 and the light emitting layer 132 may be increased by the plurality of delamination prevention patterns 715b, and thus adhesive properties may be strengthened. Accordingly, even when an impact is applied to the plurality of light emitting elements 130, separation of the anode 131 and the light emitting layer 132 is prevented, thereby preventing dark spot defects. That is, in the display device 700 according to another exemplary aspect of the present disclosure, an impact of the light emitting element 130 is mitigated by the spacer 140 and at the same time, the film delamination of the light emitting element 130 can be reduced more effectively by the delamination prevention patterns 715b. Accordingly, durability and reliability of the display device 700 may be improved, and display quality may be improved.

The exemplary aspects of the present disclosure can also be described as follows:

According to an aspect of the present disclosure, a display device includes a substrate; a bank defining a plurality of emission areas on the substrate; a plurality of light emitting elements at the plurality of emission areas; and a plurality of spacers on the bank to surround peripheral portions of the plurality of emission areas. The plurality of spacers are spaced apart from each other.

The plurality of spacers may have a closed-loop shape.

Each of the plurality of light emitting elements may include an anode including an exposed portion corresponding to each of the plurality of emission areas, and the exposed portion is exposed by the bank; a light emitting layer on the exposed portion of the anode; and a cathode on the light emitting layer. The plurality of spacers may be disposed between the bank and the light emitting layer.

The bank may include a base portion and a plurality of protrusion patterns protruding from the base portion to surround the peripheral portions of the plurality of emission areas. The plurality of protrusion patterns may overlap the plurality of spacers.

The plurality of protrusion patterns may have a closed-loop shape and may be spaced apart from each other.

The plurality of spacers may be disposed to surround the plurality of protrusion patterns.

The display device may further include a planarization layer disposed between the substrate and the bank. The planarization layer may include a base portion and a plurality of protrusion patterns protruding from the base portion to surround the peripheral portions of the plurality of emission areas. The plurality of protrusion patterns may overlap the plurality of spacers.

The plurality of protrusion patterns may have a closed-loop shape and may be spaced apart from each other.

The display device may further include a planarization layer disposed between the substrate and the bank. The planarization layer may include a plurality of delamination prevention patterns corresponding to the plurality of emission areas. The plurality of delamination prevention patterns may be convex patterns or concave patterns.

The plurality of delamination prevention patterns may be spaced apart from the bank under the plurality of light emitting elements.

The substrate may include a folding area on which folding is performed. The plurality of spacers may be disposed to surround only the plurality of emission areas in the folding area.

The substrate may include a folding area on which folding is performed. A width of the plurality of spacers surrounding the plurality of emission areas in the folding area may be greater than a width of the plurality of spacers surrounding the plurality of emission areas outside the folding area.

According to another aspect of the present disclosure, a display device includes a substrate including a plurality of sub-pixels; a plurality of light emitting elements at the plurality of sub-pixels and each of the plurality of light emitting elements include an anode, a light emitting layer, and a cathode; a bank disposed between the plurality of light emitting elements; and a plurality of impact mitigation spacers on the bank and disposed along peripheral portions of the plurality of light emitting elements. The plurality of impact mitigation spacers have a closed-loop shape.

The plurality of impact mitigation spacers may be disposed between the bank and the light emitting layer.

The plurality of impact mitigation spacers may be spaced apart from each other.

The substrate may include a folding area on which folding is performed. The plurality of impact mitigation spacers may be disposed to correspond to the plurality of light emitting elements in the folding area.

The substrate may include a folding area on which folding is performed and a non-folding area outside the folding area. A width of the plurality of spacers corresponding to the plurality of light emitting elements in the folding area may be greater than a width of the plurality of spacers corresponding to the plurality of light emitting elements in the non-folding area.

The display device may further include a planarization layer between the substrate and the bank. The planarization layer or the bank may include a plurality of impact mitigation patterns disposed along the peripheral portions of the plurality of light emitting elements. The plurality of impact mitigation patterns may overlap the plurality of impact mitigation spacers.

The plurality of impact mitigation patterns may have a closed-loop shape and may be spaced apart from each other.

The display device may further include a planarization layer disposed between the substrate and the bank. The planarization layer may include a plurality of delamination prevention patterns spaced apart from the bank under the plurality of light emitting elements. The plurality of delamination prevention patterns may be convex patterns or concave patterns.

Although the exemplary aspects of the present disclosure have been described in detail with reference to the accompanying drawings, the present disclosure is not limited thereto and may be embodied in many different forms without departing from the technical concept of the present disclosure. Therefore, the exemplary aspects of the present disclosure are provided for illustrative purposes only but not intended to limit the technical concept of the present disclosure. The scope of the technical concept of the present disclosure is not limited thereto. Therefore, it should be understood that the above-described exemplary aspects are illustrative in all aspects and do not limit the present disclosure. The protective scope of the present disclosure should be construed based on the following claims, and all the technical concepts in the equivalent scope thereof should be construed as falling within the scope of the present disclosure.

What is claimed is:

1. A display device, comprising:
   a substrate;
   a bank defining a plurality of emission areas at the substrate;
   a plurality of light emitting elements at the plurality of emission areas; and
   a plurality of spacers disposed on the bank;
   wherein each of the plurality of spacers is spaced apart from each other and arranged in an island structure, and
   wherein each of the plurality of spacers has a closed-loop shape continuously surrounding an outer periphery of each of the plurality of emission areas.

2. The display device of claim 1, wherein each of the plurality of light emitting elements includes,
   an anode including an exposed portion corresponding to each of the plurality of emission areas, wherein the exposed portion is exposed by the bank;
   a light emitting layer disposed on the exposed portion of the anode; and
   a cathode disposed on the light emitting layer,
   wherein the plurality of spacers are disposed between the bank and the light emitting layer.

3. The display device of claim 1, wherein the bank includes a base portion and a plurality of protrusion patterns protruding from the base portion and surrounding the peripheral portions of the plurality of emission areas,
   wherein the plurality of protrusion patterns overlap with the plurality of spacers.

4. The display device of claim 3, wherein the plurality of protrusion patterns have a closed-loop shape and are spaced apart from each other.

5. The display device of claim 3, wherein the plurality of spacers surrounds the plurality of protrusion patterns.

6. The display device of claim 1, further comprising a planarization layer disposed between the substrate and the bank,
   wherein the planarization layer includes a base portion and a plurality of protrusion patterns protruding from the base portion and surrounding the peripheral portions of the plurality of emission areas, and
   wherein the plurality of protrusion patterns overlap with the plurality of spacers.

7. The display device of claim 6, wherein the plurality of protrusion patterns have a closed-loop shape and are spaced apart from each other.

8. The display device of claim 1, further comprising a planarization layer disposed between the substrate and the bank,
   wherein the planarization layer includes a plurality of delamination prevention patterns corresponding to the plurality of emission areas, and
   wherein the plurality of delamination prevention patterns are convex patterns or concave patterns.

9. The display device of claim 8, wherein the plurality of delamination prevention patterns are spaced apart from the bank under the plurality of light emitting elements.

10. The display device of claim 1, wherein the substrate includes a folding area on which folding is performed, and wherein the plurality of spacers surrounds only the plurality of emission areas in the folding area.

11. The display device of claim 1, wherein the substrate includes a folding area on which folding is performed, and
wherein a width of the plurality of spacers surrounding the plurality of emission areas in the folding area is greater than a width of the plurality of spacers surrounding the plurality of emission areas outside the folding area.

12. A display device, comprising:
a substrate including a plurality of sub-pixels;
a plurality of light emitting elements at the plurality of sub-pixels and each of the plurality of light emitting elements include an anode, a light emitting layer and a cathode;
a bank disposed between the plurality of light emitting elements; and
a plurality of impact mitigation spacers disposed on the bank,
wherein each of the plurality of impact mitigation spacers are spaced apart from each other and arranged in an island structure, and
wherein each of the plurality of impact mitigation spacers has a closed-loop shape continuously surrounding an outer periphery of each of the plurality of emission areas.

13. The display device of claim 12, wherein the plurality of impact mitigation spacers is disposed between the bank and the light emitting layer.

14. The display device of claim 12, wherein the substrate includes a folding area on which folding is performed, and wherein the plurality of impact mitigation spacers are disposed to correspond to the plurality of light emitting elements in the folding area.

15. The display device of claim 12, wherein the substrate includes a folding area on which folding is performed and a non-folding area outside the folding area,
wherein a width of the plurality of spacers corresponding to the plurality of light emitting elements in the folding area is greater than a width of the plurality of spacers corresponding to the plurality of light emitting elements in the non-folding area.

16. The display device of claim 12, further comprising a planarization layer between the substrate and the bank,
wherein the planarization layer or the bank includes a plurality of impact mitigation patterns disposed along the peripheral portions of the plurality of light emitting elements, and
wherein the plurality of impact mitigation patterns overlap with the plurality of impact mitigation spacers.

17. The display device of claim 16, wherein the plurality of impact mitigation patterns have a closed-loop shape and are spaced apart from each other.

18. The display device of claim 12, further comprising a planarization layer disposed between the substrate and the bank,
wherein the planarization layer includes a plurality of delamination prevention patterns spaced apart from the bank under the plurality of light emitting elements, and
wherein the plurality of delamination prevention patterns are convex patterns or concave patterns.

* * * * *